United States Patent [19]

Itano et al.

[11] Patent Number: 4,906,862
[45] Date of Patent: Mar. 6, 1990

[54] SEMICONDUCTOR INTEGRATED CIRCUIT DEVICE HAVING POWER DOWN MODE

[75] Inventors: Kiyoshi Itano; Kohji Shimbayashi, both of Kawasaki, Japan

[73] Assignees: Fujitsu Limited, Kawasaki; Fujitsu VLSI Limited, Kasugai, both of Japan

[21] Appl. No.: 254,646

[22] Filed: Oct. 7, 1988

[30] Foreign Application Priority Data

Oct. 9, 1987 [JP] Japan .................. 62-253791

[51] Int. Cl.$^4$ ............................................. G11C 11/40
[52] U.S. Cl. ............................ 307/296.3; 307/465;
307/272.1; 365/189.03; 365/227
[58] Field of Search ............... 307/202.1, 443, 448,
307/450, 465, 468, 469, 272.1, 296.3;
365/189.03, 227

[56] References Cited

U.S. PATENT DOCUMENTS

| | | | |
|---|---|---|---|
| 4,384,220 | 5/1983 | Segawa et al. | 307/468 X |
| 4,612,459 | 9/1986 | Pollachek | 307/468 |
| 4,718,043 | 1/1988 | Akatsuka | 365/227 |
| 4,719,598 | 1/1988 | Stockton | 365/189.03 |
| 4,761,570 | 8/1988 | Williams | 307/465 |
| 4,783,606 | 11/1988 | Goetting | 307/465 |
| 4,796,234 | 1/1989 | Itoh et al. | 365/227 X |
| 4,801,820 | 1/1989 | Nootbaar | 307/465 X |
| 4,835,414 | 5/1989 | Freidin | 307/465 X |
| 4,839,539 | 6/1989 | Takata et al. | 307/465 |

FOREIGN PATENT DOCUMENTS 0021628  2/1985  Japan .................. 307/465

OTHER PUBLICATIONS

Wu, "Pin Sharing in a PLA Code", *IBM T.D.B.*, vol. 20, No. 2, 7-1977, p. 672.
Sau-Ching Wong et al., "Novel Circuit Techniques for Zero-Power 25-ns CMOS Erasable Programmable Logic Devices (EPLD's)", IEE Journal of Solid-State Circuits, vol. SC-21, No. 5, Oct., 1986.

*Primary Examiner*—David Hudspeth
*Attorney, Agent, or Firm*—Armstrong, Nikaido, Marmelstein, Kubovcik & Murray

[57] ABSTRACT

A semiconductor integrated circuit device has a plurality of terminals, an internal circuit for receiving input signals from the terminals and for outputting output signals to the terminals, where the internal circuit is enabled by a chip enable signal and disabled by a chip disable signal, a non-volatile memory for storing a pin select signal which designates at least a selected one of the terminals as a chip enable control terminal for receiving a control signal which has a first logic level when instructing a power down mode of the semiconductor integrated circuit device, and a buffer part coupled to the terminals and the non-volatile memory for generating the chip enable signal and the chip disable signal responsive to the pin select signal and the control signal. The buffer part generates the chip enable signal when the control signal received by the selected one terminal has a second logic level and generates the chip disable signal when the control signal received by the selected one terminal has the first logic level to thereby set an operation mode of the semiconductor integrated circuit device to the power down mode.

13 Claims, 9 Drawing Sheets

FIG.2
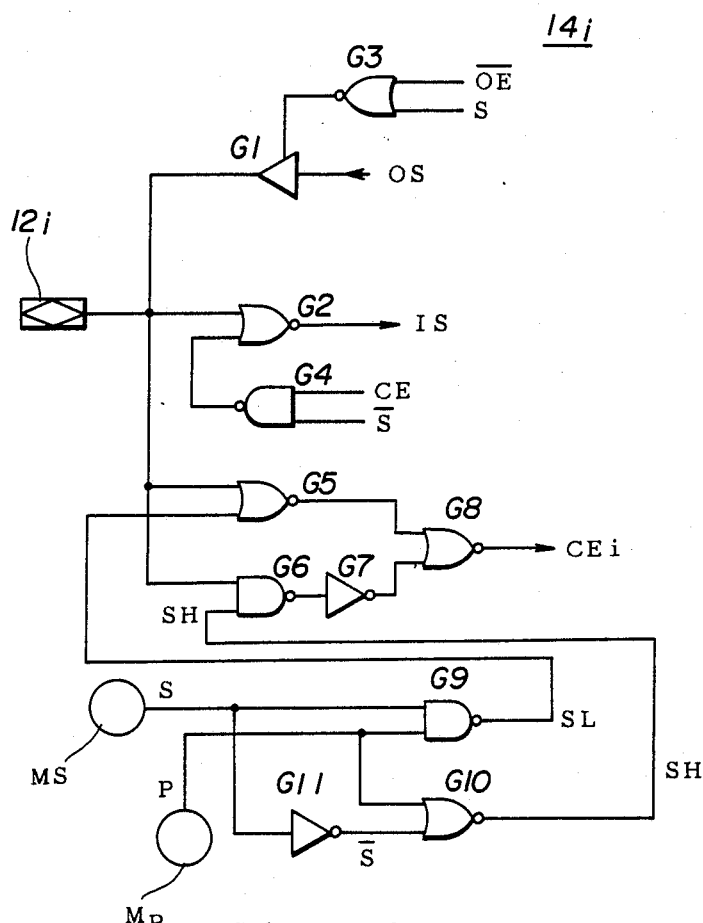
FIG.3A
FIG.3B
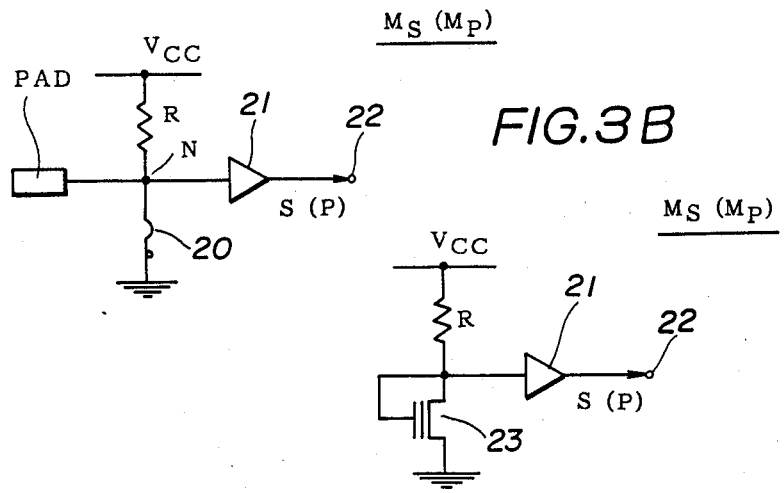

SEMICONDUCTOR INTEGRATED CIRCUIT DEVICE HAVING POWER DOWN MODE

BACKGROUND OF THE INVENTION

The present invention generally relates to semiconductor integrated circuit devices, and more particularly to a semiconductor integrated circuit device having a logic circuit which requires a power down mode such as a programmable logic circuit.

Generally, a semiconductor integrated circuit device having a plurality of memory devices and logic devices has a power down mode. In the power down mode, a signal is supplied to those devices which are not used so as to minimize the power consumption of the semiconductor integrated circuit device.

The power consumption of a programmable logic device is large in general, and the power consumption is in the order of 100 mW or more even in the case of a programmable logic device using complementary metal oxide semiconductors (CMOS). In the case of a programmable logic device using bipolar transistors, the power consumption is in the order of 200 mW or more.

Accordingly, a semiconductor integrated circuit device having such a programmable logic device requires the power down mode.

A method of automatically switching an operation mode of the programmable logic device to the power down mode is proposed in Sau-Ching Wong et al., "Novel Circuit Techniques for Zero-Power 25-ns CMOS Erasable Programmable Logic Devices (EPLD's)", IEEE Journal of Solid-State Circuits, Vol. SC-21, No. 5, October 1986. According to this proposed method, the operation mode of the semiconductor integrated circuit device is automatically switched to the power down mode when no external signal is applied to the programmable logic device or when all of the external signals applied to the programmable logic device are fixed to the high level or the low level.

On the other hand, the semiconductor integrated circuit device may be provided with a power down control terminal exclusively for setting the operation mode of the semiconductor integrated circuit device to the power down mode. In this case, the operation mode of the semiconductor integrated circuit device is switched to the power down mode when a power down control signal is applied to the power down control terminal.

For example, in an erasable and programmable read only memory (EPROM) and a static random access memory (SRAM), the power down mode means the inactive mode of the device and the power down control signal is often referred to as a chip enable signal or a chip select signal. When the semiconductor integrated circuit device is in the power down mode, the device does not enter signals other than the power down control signal.

However, in the case of the programmable logic device which automatically takes the power down mode when when no external signal is applied thereto or all of the external signals applied thereto are fixed to the high level or the low level, signals unrelated to the logic operation of the programmable logic device are also entered into the programmable logic device. For this reason, there is a problem in that it is necessary to take measures so that no external signal is applied to the programmable logic device in the power down mode so as to maintain the power down mode. But in actual practice, it is extremely difficult to take measures so that no external signal is applied to the programmable logic device in the power down mode.

On the other hand, in the case of the semiconductor integrated circuit device provided with the power down control terminal exclusively for setting the operation mode of the semiconductor integrated circuit device to the power down mode, the number of terminals which may be used by the user to achieve desired functions becomes limited because of the need to provide the power down control terminal. In other words, only a limited number of terminals can be provided on the semiconductor integrated circuit device, and if one of the limited number of terminals is used exclusively as the power down control terminal, there is a problem in that the number of terminals which may be used to achieve the desired functions becomes one less than the already limited number of terminals. As a result, the design flexibility of the semiconductor integrated circuit device becomes limited.

SUMMARY OF THE INVENTION

Accordingly, it is a general object of the present invention to provide a novel and useful semiconductor integrated circuit device in which the problems described above are eliminated.

Another and more specific object of the present invention is to provide a semiconductor integrated circuit device having a power down mode, where at least one of input terminals can be used in common as a chip enable terminal. According to the semiconductor integrated circuit device of the present invention, there is no need to provide a power down control terminal exclusively for setting an operation mode of the semiconductor integrated circuit device to the power down mode. Furthermore, there is no need to take measures so that no signal is entered into the semiconductor integrated circuit device in the power down mode.

Still another object of the present invention is to provide a semiconductor integrated circuit device having a plurality of terminals, an internal circuit for receiving input signals from the terminals and for outputting output signals to the terminals, where the internal circuit is enabled by a chip enable signal and disabled by a chip disable signal, a non-volatile memory for storing a pin select signal which designates at least a selected one of the terminals as a chip enable control terminal for receiving a control signal which has a first logic level when instructing a power down mode of the semiconductor integrated circuit device, and a buffer part coupled to the terminals and the non-volatile memory for generating the chip enable signal and the chip disable signal responsive to the pin select signal and the control signal. The buffer part generates the chip enable signal when the control signal received by the selected one terminal has a second logic level and generates the chip disable signal when the control signal received by the selected one terminal has the first logic level to thereby set an operation mode of the semiconductor integrated circuit device to the power down mode. According to the semiconductor integrated circuit device of the present invention, it is unnecessary to provide a chip enable control terminal exclusively for receiving a control signal which instructs the power down mode. As a result, the limited number of terminals of the semiconductor integrated circuit device can be fully utilized to perform desired functions of the user.

Other objects and further features of the present invention will be apparent from the following detailed description when read in conjunction with the accompanying drawings.

BRIEF DESCRIPTION OF THE DRAWINGS

FIG. 2 is a circuit diagram showing an embodiment of an input/output buffer of the semiconductor integrated circuit device shown in FIG. 1;

FIGS. 3A and 3B are circuit diagrams respectively showing an embodiment of a non-volatile memory of the input/output buffer shown in FIG. 2;

DETAILED DESCRIPTION

Figure 1:
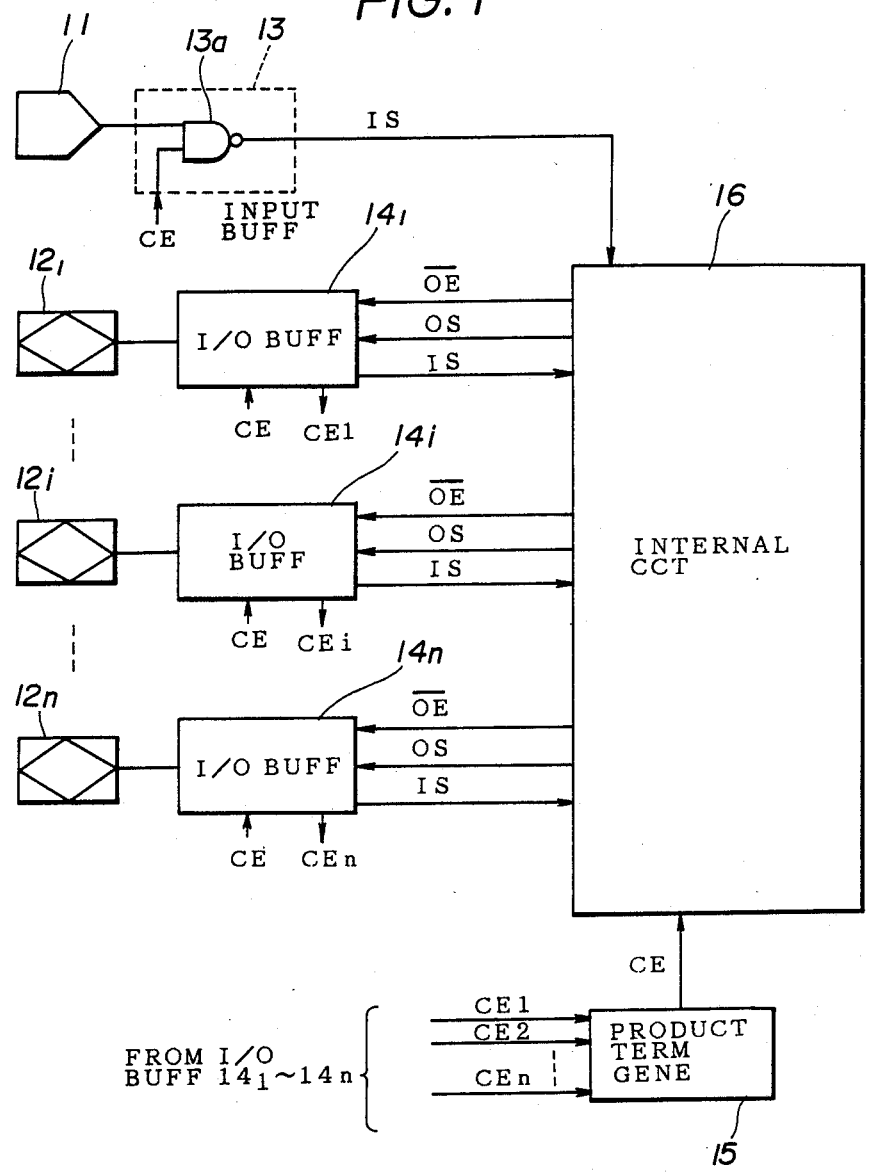
FIG. 1 is a system block diagram showing a first embodiment of a semiconductor integrated circuit device according to the present invention.

FIG. 1 shows a first embodiment of the semiconductor integrated circuit device according to the present invention. The semiconductor integrated circuit device generally has an input terminal (input pin) 11, input/output terminals (input/output pins) $12_l$ through $12_n$, an input buffer 13, input/output buffers $14_l$ through $14_n$, a product term generating circuit 15, and an internal circuit 16 which is a logic circuit, programmable logic circuit or the like. Only one input terminal 11 is shown in FIG. 1 for convenience sake, but it is of course possible to provide more than one input terminal.

In this embodiment, the input buffer 13 has a NAND gate $13a$ which is supplied with a chip enable signal CE and an input signal received through the input terminal 11. An output signal of the NAND gate $13a$ is supplied to the internal circuit 16 as an input signal IS.

The input/output buffers $14_l$ through $14_n$ have identical circuit constructions.

FIG. 2 shows an embodiment of an arbitrary input/output buffer $14_i$, where $i = 1, \ldots, n$. The arbitrary input/output buffer $14_i$ has a tri-state buffer G1, NOR gates G2, G3, G5, G8 and G10, NAND gates G4, G6 and G9, inverters G7 and G11, and non-volatile memories Ms and Mp. The tri-state buffer G1 receives an output signal OS of the internal circuit 16 and an output signal of the NOR gate G3, and an output signal of the tri-state buffer G1 is supplied to the input/output terminal $12_i$. The NOR gate G3 is supplied with an output enable signal OE and a pin select signal S. The output signal of the tri-state buffer G1 is also supplied to the NOR gates G2 and G5 and the NAND gate G6. The NOR gate G2 constitutes an input gate. An input signal received by the input/output terminal $12_i$ is supplied to the NOR gates G2 and G5 and the NAND gate G6, and the NOR gate G2 is controlled by an output signal of the NAND gate G4 which receives a chip enable signal (or input enable signal) CE. An output signal of the NOR gate G2 is supplied to the internal circuit 16 as an input signal IS, and an output chip enable signal CEi of the NOR gate G8 is supplied to the product term generating circuit 15.

In this embodiment, the input/output terminal $12_i$ is designated as a chip enable control terminal when the pin select signal S has a high level, that is, when the non-volatile memory Ms stores a logic information "1". In addition, a polarity signal P determines whether the chip enable signal CEi uses the positive or negative logic. The positive logic is selected when the polarity signal P has a high level, and the negative logic is selected when the polarity signal P has a low level. The high or low level of the polarity signal P is determined depending on whether the non-volatile memory Mp stores a logic information "1" or "0". When the polarity signal P has the high level, an output signal SL of the NAND gate G9 and an output signal SH of the NOR gate G10 respectively have a low level, and the NOR gate G5 operates as an active input gate. As a result, it is determined that the positive logic is used. On the other hand, when the polarity signal P has a low level, the NAND gate G6 operates as an active input gate. As a result, it is determined that the negative logic is used. In either case, it is assumed that the pin select signal S has the high level.

When the pin select signal S has the low level, the signal SL has a high level and the signal SH has a low level, and both the NOR gate G5 and the NAND gate G6 become inactive to prohibit the input signal from the input/output terminal $12_i$ from being outputted through the NOR gate G8. Therefore, the input/output terminal $12_i$ is used as a normal input/output terminal, that is, the operation mode of the semiconductor integrated circuit is set to an input/output mode. In this input/output mode, the chip enable signal CEi has a high level, and the input signals from the terminals 11 and $12_l$ through $12_n$ are supplied to the internal circuit 16 as the input signals IS and the output signals OS from the internal circuit 16 are outputted through the input/output terminals $12_l$ through $12_n$.

When the pin select signal S has the high level, the tri-state buffer G1 which constitutes an output buffer circuit becomes inactive to prohibit an output while the NOR gate G2 becomes inactive to prohibit an input. The NOR gate G5 and the NAND gate G6 both become active and function as gates for entering the chip enable signal CEi. The NOR gate G5 is enabled when the control signal SL has the low level. The NAND gate G6 is enabled when the control signal SH has the high level.

FIG. 3A shows an embodiment of the non-volatile memory Ms. The memory Ms has a resistor R, a fuse 20 a buffer 21 and a pad PAD. The resistor R has one terminal thereof connected to a power source voltage Vcc and the other terminal thereof connected to a node N. The node N is connected to one end of the fuse 20, the buffer 21 and the pad PAD. The other end of the fuse 20 is grounded. The buffer 21 is connected to a terminal 22. When the fuse 20 is provided, the memory Ms stores a logic information "1" and a high-level signal is obtained from the terminal 22. But when the fuse 20 is destroyed by applying a voltage to the pad PAD, the memory Ms stores a logic information "0" and a low-level signal is obtained from the terminal 22. Hence, it is possible to store an arbitrary logic information in the non-volatile memory Ms.

FIG. 3B shows another embodiment of the non-volatile memory Ms. In FIG. 3B, those parts which are essentially the same as those corresponding parts in FIG. 3A are designated by the same reference numerals, and a description thereof will be omitted. A floating gate avalanche injection MOS (FAMOS) transistor 23 is provided in place of the fuse 20. The logic information "0" or "1" is stored in the FAMOS transistor 23 by programming a threshold voltage thereof.

The non-volatile memory Mp may have a construction identical to that of the non-volatile memory Ms. For this reason, description and illustration thereof will be omitted.

Next, a description will be given of the operation of generating the chip enable signal CE. When the pin select signal S supplied to the input/output buffer $14_i$ has the low level and the input/output terminal $12_i$ is not selected as the chip enable terminal, the NOR gate G8 of the input/output buffer $14_i$ constantly outputs a high-level chip enable signal CEi. On the other hand, when the pin select signal S supplied to the input/output buffer $14_i$ has the high level and the input/output terminal $12_i$ is selected as the chip enable terminal, the NOR gate G8 of the input/output buffer $14_i$ outputs a high-level chip enable signal CEi when the NAND gate G4 of the input/output buffer $14_i$ receives a high-level chip enable signal CE.

Accordingly, the chip enable signal CE which is supplied to the internal circuit 16 may be obtained by taking a logical product of all of the chip enable signals CE1 through CEn outputted from the input/output buffers $14_l$ through $14_n$. In other words, when at least one of the chip enable signals CE1 through CEn has the low level, the level of the chip enable signal CE becomes low and the semiconductor integrated circuit device is set to the power down mode so as to make the device inactive.

Figure 4:
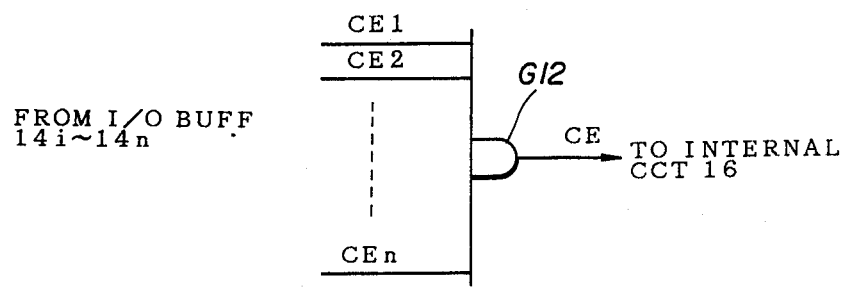
FIG. 4 is a circuit diagram showing a first embodiment of a product term generating circuit of the semiconductor integrated circuit device shown in FIG. 1.

FIG. 4 shows an embodiment of the product term generating circuit 15 for supplying the chip enable signal CE to the internal circuit 16. The product term generating circuit 15 has an n-input AND gate G12 which is supplied with the chip enable signals CE1 through CEn from the input/output buffers $14_l$ through $14_n$.

Whether or not to supply the input signal from each of the input/output terminals $12_l$ through $12_n$ to the product term generating circuit 15 and what kind of signals are to be supplied to the product term generating circuit 15 depend on the operation of the gates G5 through G11 shown in FIG. 2 and whether the pin select signal S has the high or low level. Hence, examples of rules for determining the signals to be supplied to the product term generating circuit 15 will now be described in conjunction with FIGS. 5 and 6.

Figure 5:
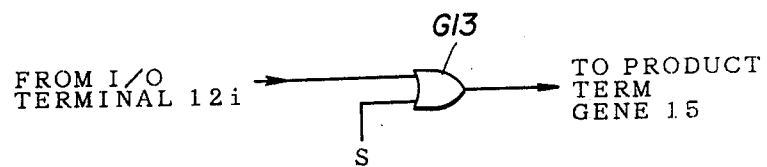
FIG. 5 is a circuit diagram showing an essential part of a modification of the input/output buffer shown in FIG. 2.

FIG. 5 shows an essential part of a modification of the input/output buffer $14_i$ shown in FIG. 2. An OR gate G13 is provided in place of the gates G5 through G8 shown in FIG. 2. In this case, it is unnecessary to provide the gates G9 and G10. The OR gate G13 is supplied with the input signal received at the input/output terminal $12_i$ and the pin select signal S. An output chip enable signal CEi of the OR gate G13 is supplied to the product term generating circuit 15 shown in FIG. 2.

When the pin select signal S has the high level in FIG. 5, the input signal from the input/output terminal $12_i$ is neglected and a high-level chip enable signal CEi is supplied to the product term generating circuit 15. On the other hand, when the pin select signal S has the low level, the input signal from the input/output terminal $12_i$ is supplied to the product term generating circuit 15 as the chip enable signal CEi. A low-level chip enable signal CE is outputted from the OR gate G13 when the input signal from the input/output terminal $12_i$ has a low level.

Figure 6:
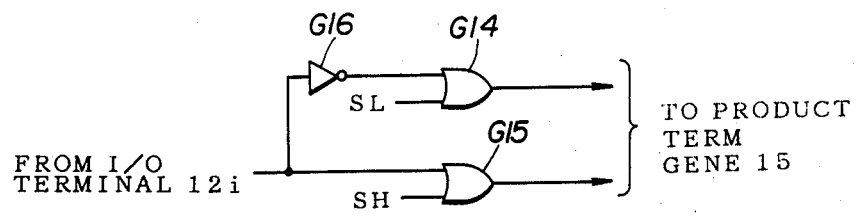
FIG. 6 is a circuit diagram showing an essential part of another modification of the input/output buffer shown in FIG. 2.

FIG. 6 shows an essential part of another modification of the input/output buffer $14_i$ shown in FIG. 2. OR gate G14 and G15 and an inverter G16 are provided in place of the gates G5 through G8 shown in FIG. 2. In this case, it is unnecessary to provide the gates G9 and G10. The inverter G16 and the OR gate G15 are supplied with the input signal from the input/output terminal $12_i$. The OR gate G14 is supplied with an output signal of the inverter G16 and the signal SL. The signal SH is also supplied to the OR gate G15.

In FIG. 6, the input signal from the input/output terminal $12_i$ is inverted and supplied to the product term generating circuit 15 as the chip enable signal CEi when the signal SL has the high level and the signal SH has the low level or vice versa. On the other hand, the input signal from the input/output terminal $12_i$ is not supplied to the product term generating circuit 15 as the chip enable signal CEi when both the signals SL and SH have the high level.

Figure 7:
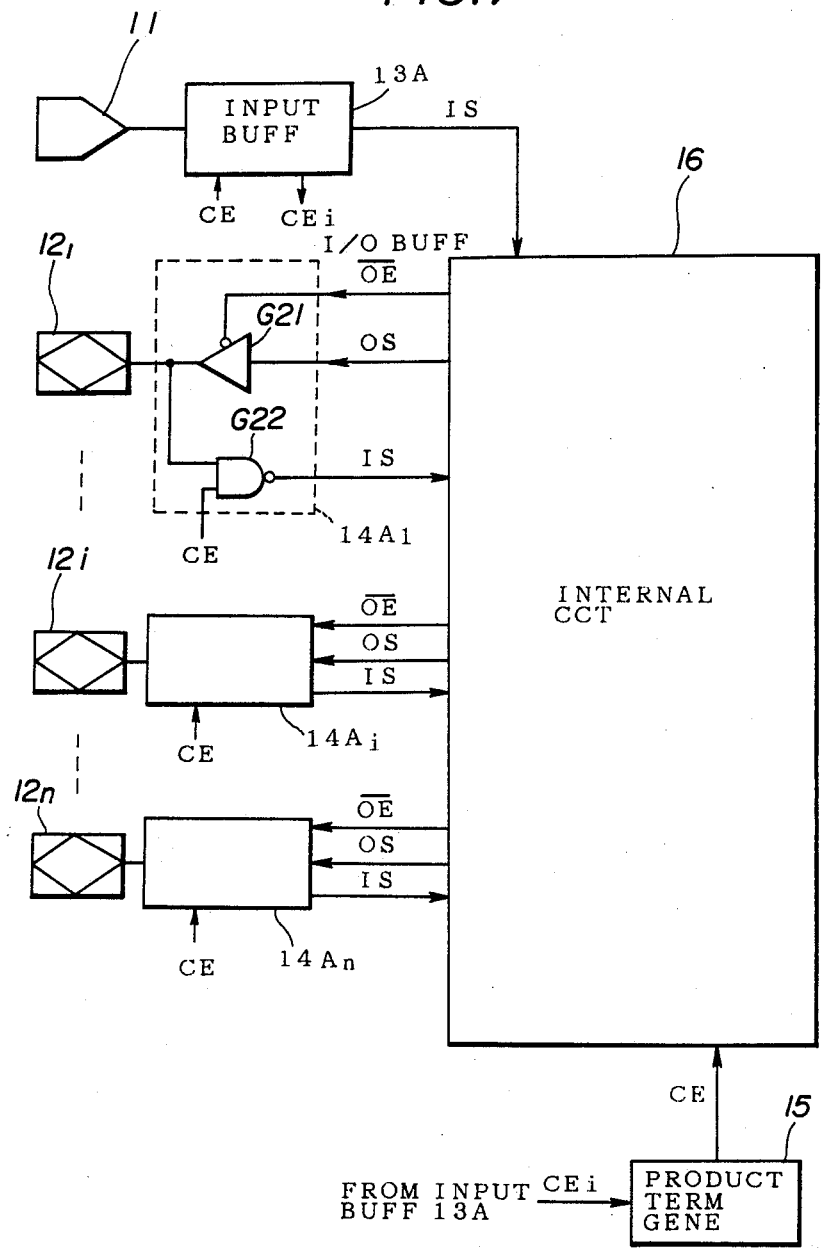
FIG. 7 is a system block diagram showing a second embodiment of the semiconductor integrated circuit device according to the present invention.

FIG. 7 shows a second embodiment of the semiconductor integrated circuit device according to the present invention. In this embodiment, the input terminal 11 can be used in common as the chip enable control terminal, but input/output terminals $12_l$ through $12_n$ are used exclusively as input/output terminals and cannot be used in common as the chip enable control terminal. In FIG. 7, those parts which are the same as those corresponding parts in FIG. 2 are designated by the same reference numerals, and a description thereof will be omitted. The input/output buffers $14A_l$ through $14A_n$ have identical constructions and each input/output buffer has a tri-state buffer G21 and a NAND gate G22 as shown only for the input/output buffer $14A_l$. As in the case of the first embodiment, it is of course possible to provide more than one input terminal 11. In this embodiment, the product term generating circuit 15 simply passes the chip enable signal CEi from the input buffer 13A as the chip enable signal CE, and the product term generating circuit 15 may be omitted.

Figure 8:
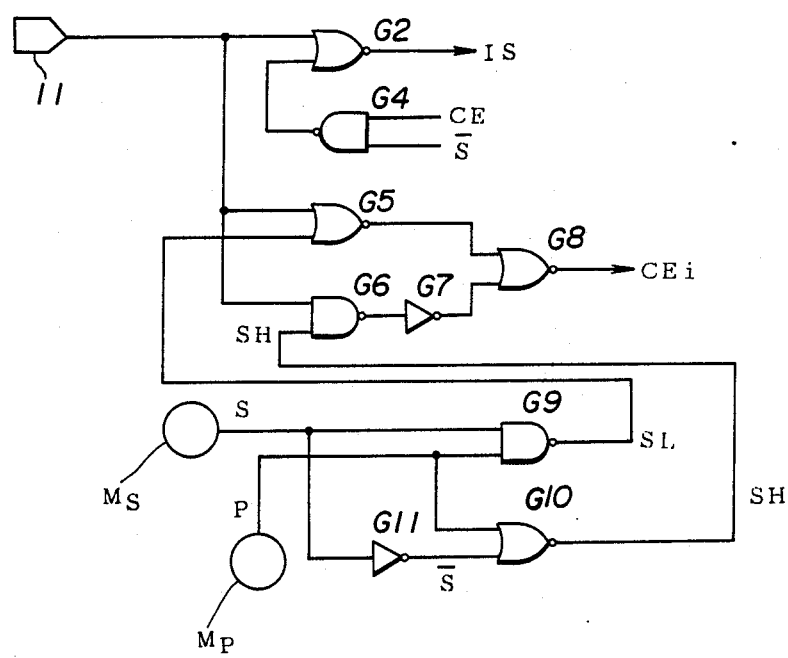
FIG. 8 is a circuit diagram showing an embodiment of an input buffer of the semiconductor integrated circuit device shown in FIG. 7.

FIG. 8 shows an embodiment of the input buffer 13A. In FIG. 8, those parts which are the same as those corresponding parts in FIG. 2 are designated by the same reference numerals, and a description thereof will be omitted.

Therefore, in the present invention, it is possible to provide the circuit shown in FIG. 8 with respect to at least one of the input terminals, or provide the circuit shown in FIG. 2 with respect to at least one of the input/output terminals. In other words, at least one terminal out of the input terminals and the input/output terminals may be used in common as the chip enable control terminal. This means of course that all of the terminals may be used in common as the chip enable control terminal, but it is desirable to use only selected terminals in common as the chip enable control terminal when considering the integration density and production cost of the semiconductor integrated circuit device.

Figure 9:
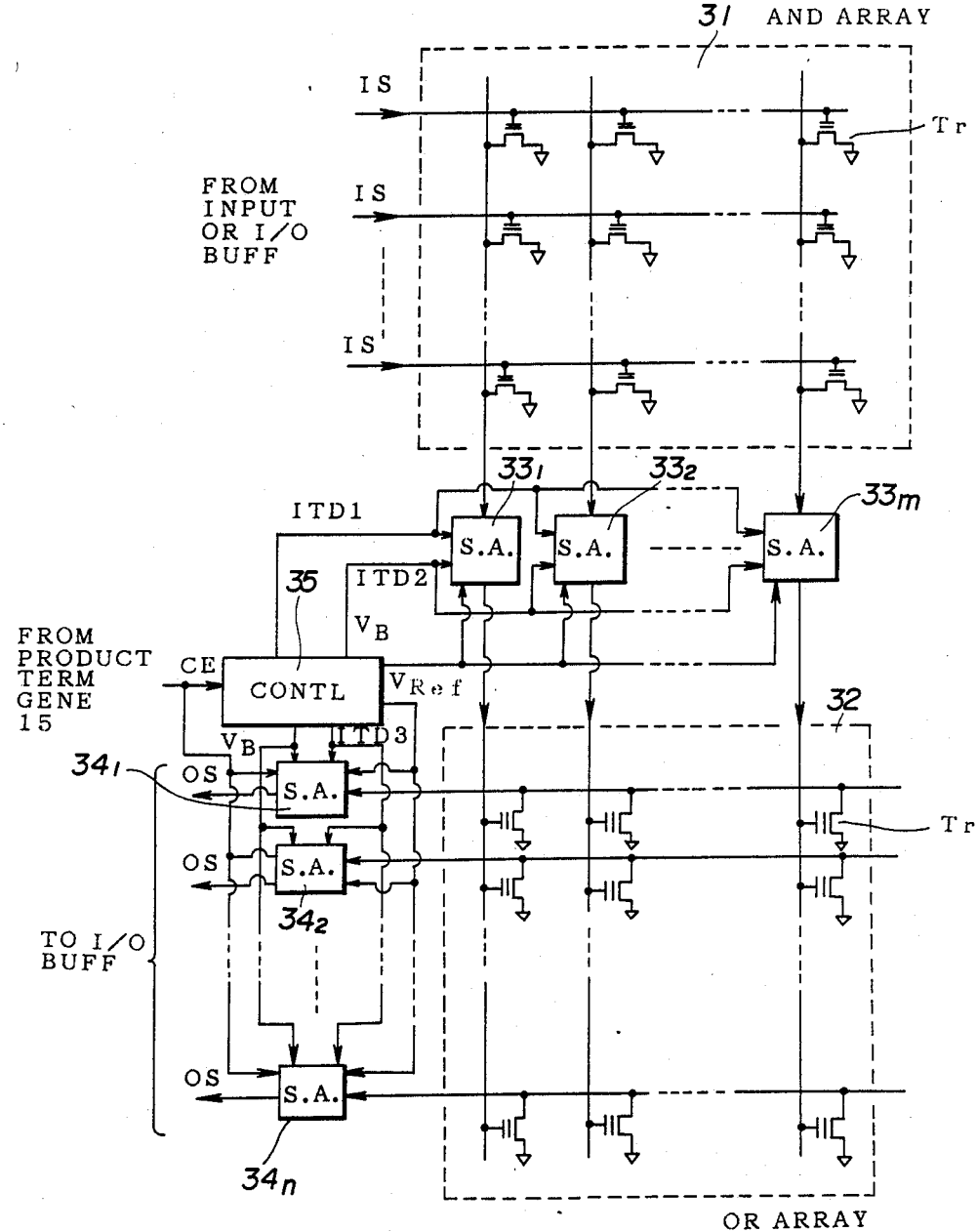
FIG. 9 is a circuit diagram showing an embodiment of an internal circuit of the semiconductor integrated circuit shown in FIGS. 1 and 7.

FIG. 9 shows an embodiment of the internal circuit 16 shown in FIGS. 1 and 7. The internal circuit 16 has an AND array 31, and OR array 32, sense amplifiers $33_l$ through $33_m$, sense amplifiers $34_l$ through $34_n$, and a control circuit 35. In FIG. 9 and figures which follow, a downwardly pointing arrow indicates that a line is connected to the ground (GND).

The AND array 31 and the OR array 32 are respectively constituted by cell transistors made up of FAMOS transistors Tr connected in a matrix arrangement as shown. The AND array 31 and the OR array 32 are programmed by varying the threshold voltages of the respective FAMOS transistors Tr.

The signals IS from the input/output buffers $14_l$ through $14_n$ (or $14A_l$ through $14A_n$) and/or the input buffer 13 (or 13A) are applied to gates of the corresponding FAMOS transistors Tr within the AND array 31. Output signals of the AND array 31 are amplified in the sense amplifiers $33_l$ through $33_m$ and are applied to gates of the corresponding FAMOS transistors Tr within the OR array 32. Output signals OS of the OR array 32 are amplified in the sense amplifiers $34_l$ through $34_n$ and are supplied to the corresponding input/output buffers $14_l$ through $14_n$ (or $14A_l$ through $14A_n$).

The sense amplifiers $33_l$ through $33_m$ and $34_l$ through $34_n$ are controlled by control signals ITD1 through ITD3, a bias voltage $V_B$, and a reference voltage $V_{Ref}$ from the control circuit 35. In order to reduce the power consumption, the sense amplifiers $33_l$ through $33_m$ and $34_l$ through $34_n$ are set to the power down mode by the control circuit 35 when the chip enable signal CE from the product term generating circuit 15 has a low level and instructs the internal circuit 16 to be disabled.

Figure 10:
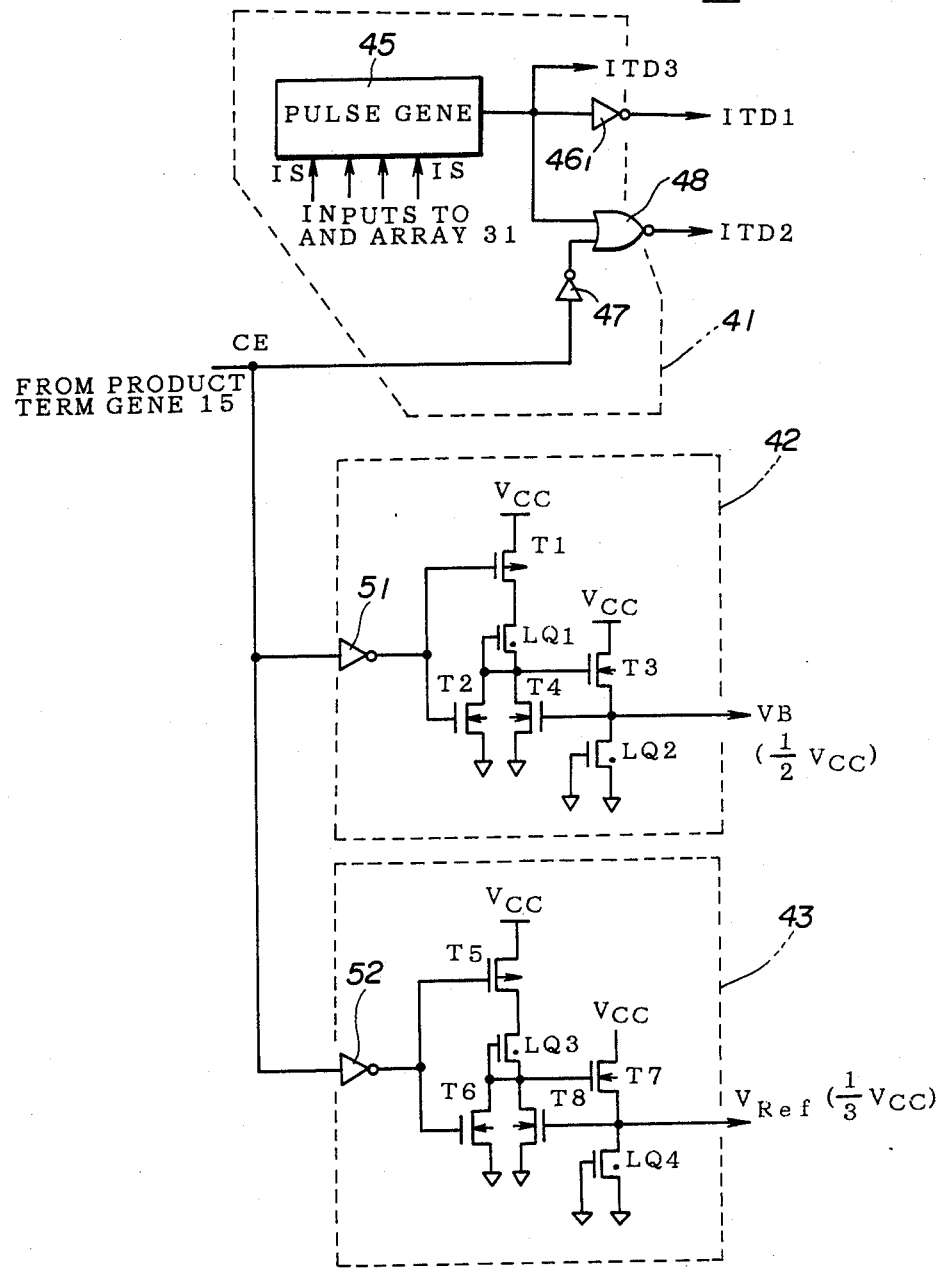
FIG. 10 is a circuit diagram showing an embodiment of a control circuit of the internal circuit shown in FIG. 9.

FIG. 10 shows an embodiment of the control circuit 35. The control circuit 35 has circuit parts 41, 42 and 43. The circuit part 41 generates the control signals ITD1 through ITD3 and has a pulse generator 45, inverters 46 and 47, and a NOR circuit 48 which are connected as shown. The pulse generator 45 is supplied with the signals IS supplied to the AND array 31. The pulse generator 45 generates a high-level control signal ITD3 when a change is detected in the signals IS. The control signal ITD2 is an inverted signal of the control signal ITD3 when the chip enable signal CE has a high level and instructs the internal circuit 16 to be enabled. The control signal ITD2 is forcibly set to a low level when the chip enable signal CE has a low level. The control signal ITD1 is an inverted signal of the control signal ITD3.

The circuit part 42 generates the bias voltage $V_B$ and has an inverter 51, transistors T1 through T4, and depletion type load transistors LQ1 and LQ2 which are connected as shown. When the chip enable signal CE has the high level, a current flows through the load transistors LQ1 and LQ2 and $V_B = V_{cc}/2$ because the transistor T1 is ON. Vcc denotes a power source voltage. On the other hand, in the power down mode when the chip enable signal CE has the low level, a steady state current flowing through the load transistors LQ1 and LQ2 is cut off and $V_B = 0$ because the transistor T1 is OFF, the transistor T2 is ON and the transistor T3 is OFF.

The circuit part 43 generates the reference voltage $V_{Ref}$ and has an inverter 52, transistors T5 through T8, and depletion type load transistors LQ3 and LQ4 which are connected as shown. The circuit construction and operation of the circuit part 43 are basically the same as those of the circuit part 42 except that the parameters of the transistors T7 and LQ4 are different from those of the transistors T3 and LQ2, so that $V_{Ref} = V_{cc}/3$ when the chip enable signal CE has a high level and $V_{Ref} = 0$ when the chip enable signal CE has a low level.

Figure 11:
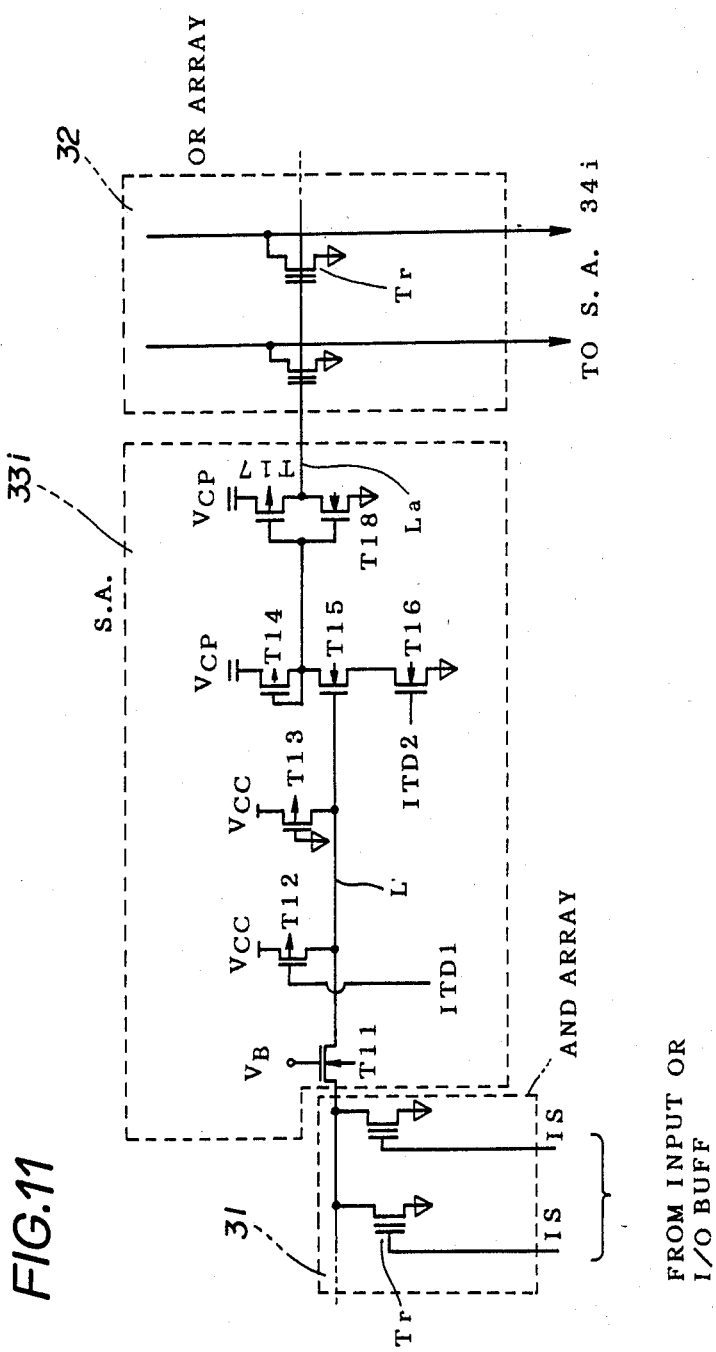
FIG. 11 is a circuit diagram showing an embodiment of an arbitrary sense amplifier together with a portion of an AND array and an OR array of the internal circuit shown in FIG. 9.

FIG. 11 shows an embodiment of an arbitrary sense amplifier $33_i$ together with a portion of the AND array 31 and the OR array 32. The sense amplifier $33_i$ has transistors T11 through T18.

When the chip enable signal CE has the high level and the signals IS supplied to the AND array 31 change, the level of the control signal ITD1 becomes low, the transistor T12 becomes ON and a product term line L is precharged. The level of the control signal ITD2 becomes high when the level of the control signal ITD1 becomes high, and the transistor T16 is turned ON thereby making the transistors T14 through T16 operate as an inverter. The product term line L is maintained at the precharged level or is discharged depending on the ON/OFF state of the cell transistors Tr of the AND array 31. The level of the product term line L is transmitted to a product term line La.

When the chip enable signal CE has the low level, the control signal ITD2 is forcibly set to the low level and the transistor T16 is turned OFF. As a result, a current path through the transistors T14 through T16 is cut off, and the sense amplifier $33_i$ and thus the internal circuit 16 are set to the power down mode.

For example, the power source voltage Vcc is set to 5 V, and a power source voltage Vcp is normally set to 5 V and set to a little over 10 V during the programming.

Figure 12:
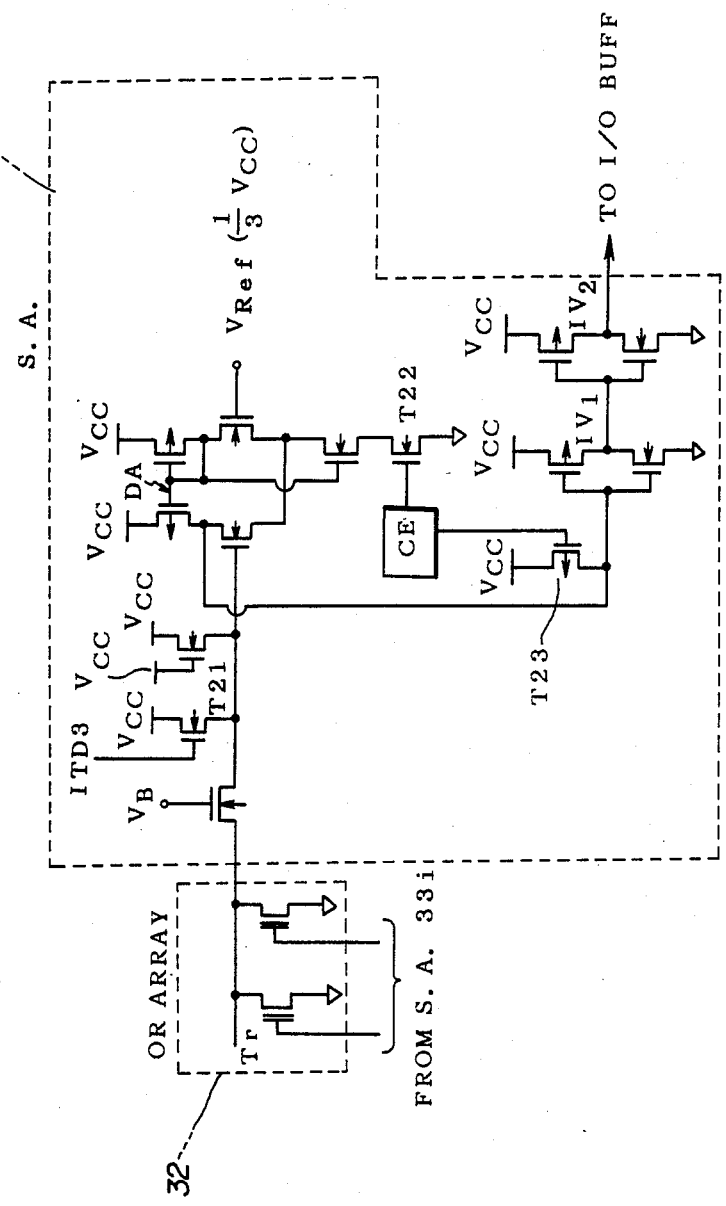
FIG. 12 is a circuit diagram showing an embodiment of another arbitrary sense amplifier together with a portion of the OR array of the internal circuit shown in FIG. 9.

FIG. 12 shows an embodiment of an arbitrary sense amplifier $34_i$ together with a portion of the OR array 32. The sense amplifier $34_i$ generally has a differential amplifier DA, inverters IV1 and IV2, and transistors which are connected as shown.

When the chip enable signal CE has the high level, a transistor T22 becomes ON and the transistor T23 becomes OFF. A transistor T21 is turned ON at a certain time responsive to the control signal ITD3, and the output line of the OR array 32 is precharged. The level at the output line of the OR array 32 is transmitted to the differential amplifier DA and an output of the differential amplifier DA is applied to the inverter IV1.

On the other hand, when the chip enable signal CE has the low level, the transistor T22 becomes OFF and the transistor T23 becomes ON. The differential amplifier DA does not operate because the transistor T22 is OFF, and no current consumption takes place. The transistor T23 is turned ON to fix the input of the inverter IV1 to a high level because the output of the differential amplifier DA (that is, the input of the inverter IV1) would otherwise be unstable (or undefined) and a steady state current would flow through the inverter INV1. But by taking this measure, no steady state current flows through the inverter IV1.

In the described embodiments, the pin select signal S must be designated for each input terminal (or input/output terminal) which is also used as the chip enable control terminal. However, it is not essential that the polarity signal P is designated for each input terminal (or input/output terminal) which is also used as the chip enable control terminal, and the same polarity signal P may be used with respect to all of the input terminals (or input/output terminals) which are also used as the chip enable control terminal.

When the terminal which may also be used as the chip enable control terminal is not selected for use as the chip enable control terminal, the semiconductor integrated circuit device is of course in an active state. In other words, when the semiconductor integrated circuit device is to be put into the active state, no designation of the chip enable control terminal is made.

The circuit construction of the input buffer, the input-/output buffer and the product term generating circuit is not limited to those of the described embodiments. Other circuit constructions are possible to achieve the desired functions of the buffers and the product term generating circuit.

In addition, it is not essential that the semiconductor integrated circuit device has input/output terminals, and the semiconductor integrated circuit device may simply have input terminals exclusively for receiving input signals and output terminals exclusively for outputting output signals. In this case, at least one of the input terminals is used in common as the chip enable control terminal.

Further, the present invention is not limited to these embodiments, but various variations and modifications may be made without departing from the scope of the present invention.

What is claimed is:

1. A semiconductor integrated circuit device comprising:
    a plurality of terminals for receiving input signals and for outputting output signals;
    an internal circuit for receiving the input signals from said terminals and for outputting the output signals to said terminals, said internal circuit being enabled by a chip enable signal and disabled by a chip disable signal;
    a non-volatile memory for storing a pin select signal which designates at least a selected one of said terminals as a chip enable control terminal for receiving a control signal which has a first logic level when instructing a power down mode of the semiconductor integrated circuit device; and
    a buffer part coupled to said terminals and said non-volatile memory for generating the chip enable signal and the chip disable signal responsive to the pin select signal and the control signal, said buffer part generating the chip enable signal when the control signal received by the selected one terminal has a second logic level and generating the chip disable signal when the control signal received by the selected one terminal has the first logic level to thereby set an operation mode of the semiconductor integrated circuit device to the power down mode.

2. A semiconductor integrated circuit device as claimed in claim 1 in which said selected one terminal is an input terminal, said buffer part having a logic circuit for passing a signal received by said selected one terminal to said internal circuit when the chip enable signal is generated and for prohibiting the signal received by said selected one terminal from being supplied to said internal circuit when the chip disable signal is generated.

3. A semiconductor integrated circuit device as claimed in claim 2 in which said buffer part passes the signal received by said selected one terminal to said internal circuit as the chip enable signal or the chip disable signal when the chip enable signal is generated, said chip disable signal being an inverted signal of the chip enable signal.

4. A semiconductor integrated circuit device as claimed in claim 1 in which said selected one terminal is an input/output terminal, said buffer part having a logic circuit for passing a signal received by said selected one terminal to said internal circuit and passing a signal received from said internal circuit to said selected one terminal when the chip enable signal is generated and for prohibiting the signal received by said selected one terminal from being supplied to said internal circuit and prohibiting the signal received from said internal circuit from being supplied to said selected one terminal when the chip disable signal is generated.

5. A semiconductor integrated circuit device as claimed in claim 4 in which said buffer part passes the signal received by said selected one terminal to said internal circuit as the chip enable signal or the chip disable signal when the chip enable signal is generated, said chip disable signal being an inverted signal of the chip enable signal.

6. A semiconductor integrated circuit device as claimed in claim 1 in which said buffer part has a logic circuit for determining whether a positive logic or a negative logic is to be used in the semiconductor integrated circuit device, said logic circuit having a non-volatile memory for storing a polarity signal which determines the logic to be used.

7. A semiconductor integrated circuit device as claimed in claim 1 in which said internal circuit includes a programmable logic device.

8. A semiconductor integrated circuit device as claimed in claim 1 in which said non-volatile memory is provided with respect to all of input terminals out of said terminals, at least one non-volatile memory storing a pin select signal which designates a selected one of said input terminals as a chip enable control terminal for receiving the control signal which has the first logic level when instructing the power down mode of the semiconductor integrated circuit device.

9. A semiconductor integrated circuit device as claimed in claim 8 in which said buffer part generates the chip disable signal when at least one selected input terminal designated by the pin select signal receives the control signal having the first logic level.

10. A semiconductor integrated circuit device as claimed in claim 1 in which said non-volatile memory is provided with respect to all of input/output terminals out of said terminals, at least one non-volatile memory storing a pin select signal which designates a selected one of said input/output terminals as a chip enable control terminal for receiving the control signal which has the first logic level when instructing the power down mode of the semiconductor integrated circuit device.

11. A semiconductor integrated circuit device as claimed in claim 10 in which said buffer part generates the chip disable signal when at least one selected input-/output terminal designated by the pin select signal receives the control signal having the first logic level.

12. A semiconductor integrated circuit device as claimed in claim 1 in which said non-volatile memory is provided with respect to all of input terminals and all of input/output terminals out of said terminals, at least one non-volatile memory storing a pin select signal which designates a selected one of said input terminals and said input/output terminals as a chip enable control terminal for receiving the control signal which has the first logic level when instructing the power down mode of the semiconductor integrated circuit device.

13. A semiconductor integrated circuit device as claimed in claim 12 in which said buffer part generates the chip disable signal when at least one selected input or input/output terminal designated by the pin select signal receives the control signal having the first logic level.

* * * * *